United States Patent [19]
He et al.

[11] Patent Number: 5,847,548
[45] Date of Patent: Dec. 8, 1998

[54] CURRENT-SHARING PASSIVE SNUBBER FOR PARALLEL-CONNECTED SWITCHES AND HIGH POWER BOOST CONVERTER EMPLOYING THE SAME

[75] Inventors: Jin He, Plano; Mark E. Jacobs, Dallas, both of Tex.

[73] Assignee: Lucent Technologies Inc., Murray Hill, N.J.

[21] Appl. No.: 939,075

[22] Filed: Sep. 26, 1997

[51] Int. Cl.$^6$ ........................................................ G05F 1/10
[52] U.S. Cl. ................................................................ 323/222
[58] Field of Search ................................... 323/220, 222; 363/55, 56

[56] References Cited

U.S. PATENT DOCUMENTS

| | | | |
|---|---|---|---|
| 4,849,873 | 7/1989 | Vanderhelst | 363/55 |
| 5,550,458 | 8/1996 | Farrington et al. | 323/222 |
| 5,633,579 | 5/1997 | Kim | 323/222 |
| 5,712,536 | 1/1998 | Haas et al. | 315/247 |

OTHER PUBLICATIONS

Tore Undeland, Frode Jenset, Arne Steinbakk, Terje Rogne and Hagnar Hernes, "A snubber Configuration for Both Power Transistors and GTO PWM Inverters", 1984 IEEE, pp. 42–53.

Guichao Hua, Ching–Shan Leu, and Fred C. Lee, "Novel Zero–Voltage–Transition PWM Converters", 1992 IEEE, pp. 55–61.

Jin He, Ned Mohan, and Chuck Wong, "Unity Power Factor Three–Phase Diode Bridge AC–DC Converter with Soft Switchings", 1993 IEEE, pp. 514–519.

Ionel Dan Jitaru, "Soft Transitions Power Factor Correction Circuit", HFPC 1993 Proceedings, pp. 202–208.

Nigel Machin and Tino Vescovi, "Very High Efficiency Techniques and Their Selective Application to the Design of a 70A Rectifier", S.6.C Rectifiers, Battery Chargers, 1993, pp. 126–133.

Richard Garcia, Rui Liu and Victor Lee, "Optimal Design for Natural Convection–Cooled Rectifiers", 1996 IEEE, pp. 813–822.

Ray L. Lin and Fred C. Lee, "Novel–Zero–Current–Switching–Zero–Switching Converters", 1996 IEEE, pp. 438–442.

*Primary Examiner*—Matthew V. Nguyen

[57] ABSTRACT

For use in a boost converter having first and second boost switches coupled in parallel, a snubber for, and method of, improving current sharing between the first and second boost switches. In one embodiment, the snubber includes: (1) first and second snubber inductors, series-coupled with the first and second boost switches, respectively, that limit a flow rate of the electrical current in the first and second switches, respectively, as a function of a rate of the flow and (2) a conductive path, including a first zener diode coupled to a first node between the first snubber inductor and the first boost switch and a second zener diode coupled to a second node between the second snubber inductor and the second boost switch, that conducts a turn-off energy of said first and second boost switches from the first and second nodes toward an output of the boost converter.

21 Claims, 6 Drawing Sheets

CURRENT-SHARING PASSIVE SNUBBER FOR PARALLEL-CONNECTED SWITCHES AND HIGH POWER BOOST CONVERTER EMPLOYING THE SAME

TECHNICAL FIELD OF THE INVENTION

The present invention is directed, in general, to power conversion and, more specifically, to a current-sharing passive snubber for parallel-connected switches, a method of operating such passive snubber and a high power boost converter employing the snubber or the method.

BACKGROUND OF THE INVENTION

Boost power converters are widely used in various power conversion applications, such as single-phase and three-phase power factor corrected AC/DC rectifiers and DC/AC inverters. As the power converters' switching frequencies and output power levels are increased to accomplish system application requirements, such as size reduction, multiple ultra-fast switching semiconductor devices are required to be parallel-connected to form main boost switches, which are turned on and off simultaneously.

Isolated-gate bipolar transistors (IGBTs) have much lower conduction losses as compared with field-effect transistors (FETs) and much faster switching capabilities and easier gate drive control when compared to bipolar junction transistors (BJTs) and gate turnoff thyristors (GTOs). The IGBT, with its faster switching speed and lower conduction losses, has become the preferred semiconductor switching device for use in high frequency and high power applications.

Unfortunately, IGBTs used as switches do not tend to share current well, especially when two or more IGBTs are parallel-connected. The current-sharing capability of the switching devices is important for high frequency and high power applications where multiple power switching devices are connected in parallel to handle the required current. In most cases, the parallel-connected IGBT switching devices do not share the current well, primarily because of the negative temperature coefficient of their on-state resistances, mismatched device characteristics and circuit layout in which it is employed. To overcome the poor current-sharing capabilities of the parallel-connected IGBTs, more semiconductor devices are used to increase the device current margin. Unfortunately, increasing the number of devices also increases the likelihood of mismatching each device characteristics, the complexity of printed wiring board (PWB) circuit layout and the overall cost. As a result of the unpredictable current-sharing capabilities of the parallel-connected IGBTs, the overall system cost is increased and the reliability substantially reduced.

Various passive and active snubber circuits have been developed either to reduce the boost diode reverse recovery current and the boost switch turn-on or boost switch turn-off loss. For examples of active and passive snubber circuits, see "A Snubber Configuration for Both Power Transistor and GTO PWM Inverters" by T. M. Undeland et al., 1984 Power Electronics Specialists' Conference (PESC), pp. 42–53; "Novel Zero-Voltage Transition PWM Converter" by G. C. Hua et al., 1992 PESC Proceeding, pp. 55–61; "Low-Loss Snubber for a Power Factor Corrected Boost Converter," U.S. Pat. No. 5,550,458, issued to Farrington et al.; "Unity Power Factor Three-Phase Diode Bridge AC-DC Converter with Soft Switchings" by J. He et al., 1993 IEEE PCC-Yokohama Proceedings pp. 514–519; "Soft Transitions Power Factor Correction Circuit" by I. D. Jitaru, 1993 High Freq. Power Conversation Conf., pp. 202–208; "Very High Efficiency Techniques and Their Selective Application to the Design of a 70A Rectifier" by N. Machine and T. Vescovi, 1993 INTELEC Proceeding, pp. 126–133; "Optimal Design for Natural Convection-Cooled Rectifiers" by R. Garcia et al., 1996 IEEE INTELEC Proceeding, pp. 813–822; and "Novel Zero-Current-Switching-Zero-Voltage Switching Converters" by R. Lin and F. C. Lee, 1996 PESC Proceeding, pp. 438–442, all of which are incorporated herein by reference.

These snubber circuits, however, do not provide for current-sharing in multiple switch applications. Accordingly, what is needed in the art is an improved snubber circuit that provides current-sharing for multiple parallel-connected semiconductor power switches.

SUMMARY OF THE INVENTION

To address the above-discussed deficiencies of the prior art, the present invention provides, for use in a boost converter having first and second boost switches coupled in parallel, a snubber for, and method of, improving current sharing between the first and second boost switches. In one embodiment, the snubber includes: (1) first and second snubber inductors, series-coupled with the first and second boost switches, respectively, that limit a flow rate of the electrical current in the first and second switches, respectively, as a function of a rate of the flow and (2) a conductive path coupled to a first node between the first snubber inductor and the first boost switch and a second node between the second snubber inductor and the second boost switch, that conducts a turn-off energy of the first and second switches from the first and second nodes toward an output of the boost converter.

The present invention therefore introduces the broad concept of employing the current change rate-limiting tendencies of inductors to balance the current conducted through parallel-coupled power switches. The reverse recovery current of the boost diode(s) is also limited by the first and second snubber inductors and is routed to the output of the boost converter.

In one embodiment of the present invention, the first and second boost switches are insulated gate bipolar transistors (IGBTs). As explained above, such switches do not share current well. However, the present invention applies equally to other devices that would benefit from current-sharing management.

In one embodiment of the present invention, the conductive path further comprises first and second snubber diodes series-coupled with first and second zener diodes, respectively. The first and second snubber diodes prevent electrical currents from passing directly between the first and second boost switches. Alternatively, the first and second snubber diodes may be series-coupled with first and second resistors, respectively. The first and second snubber diodes (or resistors) prevent electrical currents from passing directly between the first and second boost switches and from the output of the converter or from passing via another sub-circuit. The zener diodes (or resistors) are used to suppress the high frequency current "rings" (oscillations) due to the parasitic effects, and hence to reduce electromagnetic interference (EMI) noise.

In one embodiment of the present invention, the conductive path conducts the turn-off energy of the first and second boost switches to an output terminal of a boost diode of the boost converter after the boost diode has stopped the reverse recovery. In an alternative embodiment, the conductive path is coupled to power terminals of the first and second boost switches and conducts the turn-off energy of the first and second boost switches to an input terminal of a boost diode of the boost converter. For purposes of the present invention, a "power terminal" is defined as a terminal designed to conduct power (such as a source, drain, emitter or collector) as opposed to a "control terminal" (such as a gate or base). In yet another alternative embodiment, the conductive path is coupled to power terminals of the first and second boost switches and conducts the turn-off energy of the first and second boost switches to both input and output terminals of a boost diode of the boost converter. These alternative embodiments may be employed not only to yield current-sharing of the first and second boost switches, but also provide soft switching for the first and second boost switches during turn-on and turn-off transitions.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
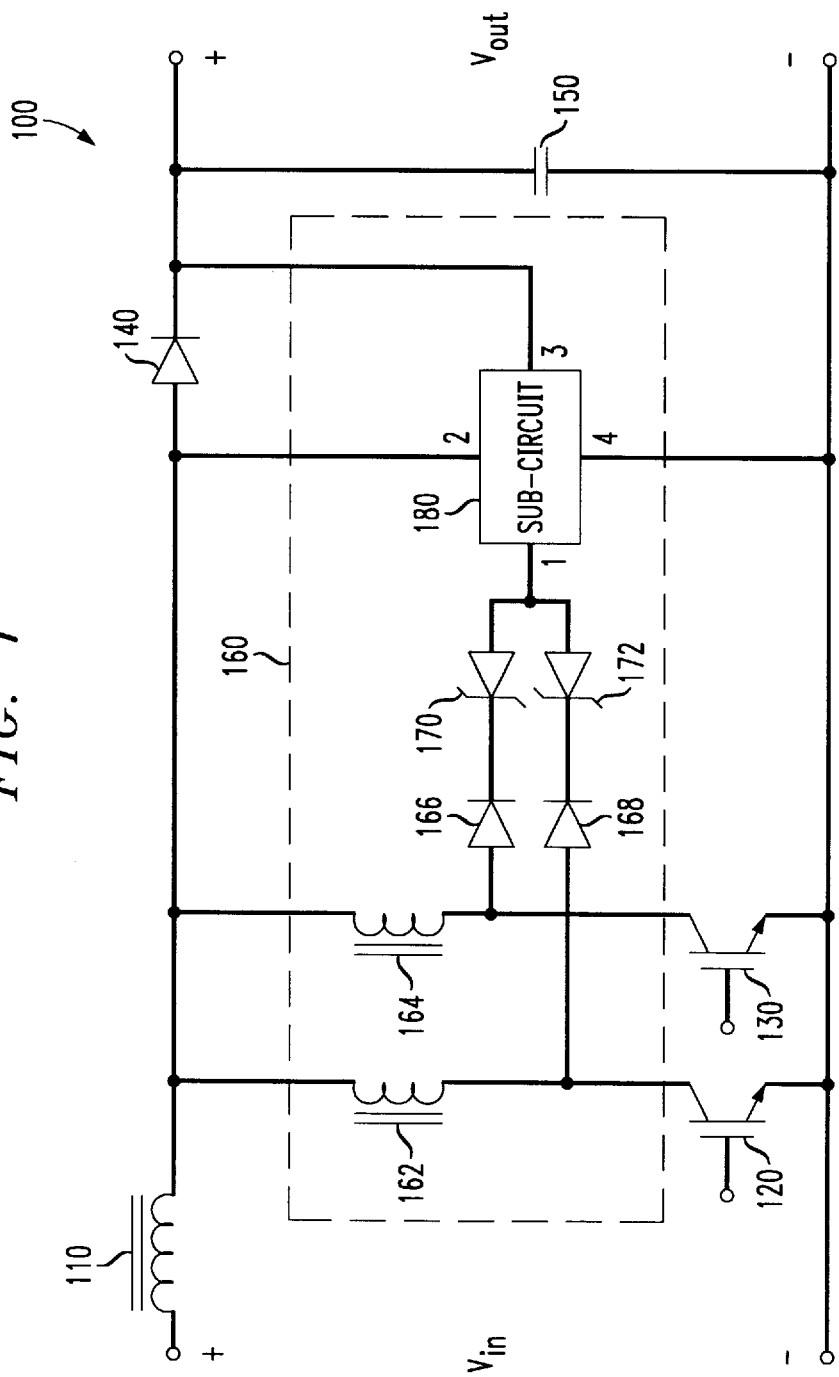
FIG. 1 illustrates a schematic diagram of an embodiment of a multiple switch parallel-connected boost converter employing a passive current-sharing snubber circuit constructed according to the principles of the present invention.

Referring initially to FIG. 1, illustrated is a schematic diagram of an embodiment of a multiple switch parallel-connected boost converter 100 employing a passive current-sharing snubber circuit 160 constructed according to the principles of the present invention. The boost converter 100 includes a boost inductor 110 that is coupled to the current-sharing snubber circuit 160. A boost diode 140 is also coupled to the boost inductor 110 and the current-sharing snubber circuit 160. Also shown is an output capacitor 150 that is coupled to the boost diode 140 and to first and second switches 120, 130 (which cooperate to perform the function of a single, larger boost switch). In the illustrated embodiment, the first and second boost switches 120, 130 are IGBTs having the inherent current-sharing difficulties described in the Background of the Invention section above.

The current-sharing snubber circuit 160 includes first and second snubber inductors 162, 164 that are coupled to first and second snubber diodes 166, 168, respectively. In an advantageous embodiment, the first and second snubber inductors 162, 164 are a matched pair of linear inductors, i.e., equal value. The matched first and second inductors 162, 164 facilitate the current sharing feature of the present invention. The first and second snubber diodes 166, 168 are also coupled to first and second snubber zener diodes 170, 172, respectively. Alternatively, in another embodiment, the first and second snubber diodes 166, 168 are coupled to a first and second snubber resistors, respectively, which may be substituted for the first and second snubber zener diodes 170, 172. The first and second snubber diodes 166, 168 (or resistors) prevent electrical currents from passing directly between the first and second boost switches 120, 130 and from the output of the converter 100 or from passing via another sub-circuit. The zener diodes (or resistors) are used to suppress the high frequency current "rings" (oscillations) due to parasitic effects, and hence to reduce electromagnetic interference (EMI) noise.

The basic structure of the current-sharing snubber circuit having been set forth, its operation can now be described. Assuming that both the first and second boost switches 120, 130 are turned ON and OFF nearly simultaneously and that the second boost switch 130 begins to conduct after the first boost switch 120 due to the differences in gate capacitances and stray inductances in the first and second switches 120, 130 circuit layout, the di/dt of the first boost switch 120 is higher than the di/dt of the second boost switch 130 during the same time period. The presence of the higher di/dt in the first boost switch 120 generates a higher voltage across the first snubber inductor 162. This higher voltage is also applied to the circuit branch formed by the second snubber inductor 164 and the second boost switch 130. This voltage is higher than the collector-emitter saturation voltage for the second boost switch 130 (typically between 1.5 V and 2.5 V for an IGBT). Therefore, the current in the second snubber inductor 164 is forced to increase. The voltage and the inductance of the snubber inductor 164 thus determine its di/dt.

The current-sharing process described above is a dynamic process. In practice, a small turn-on delay between the first and second boost switches 120, 130 is typically experienced due to variations in the IGBTs' gate capacitances, gate drive components used and the circuit layout. Without a current-sharing snubber, the small delay can cause even two identical switches with the same device characteristics to have a large current and thermal unbalance. The poor current-sharing abilities of the first and second boost switches 120, 130 may cause the first and second boost switches 120, 130 to fail prematurely or, alternatively, may require additional and more complex circuitry to provide a sufficient current margin to protect the first and second boost switches 120, 130.

The sub-circuit 180 completes the current-sharing snubber circuit and can assume different circuit configurations, depending upon the characteristics desired. Three different circuit configurations in the sub-circuit 180 are illustrated in FIGS. 2A, 2B and 2C, respectively.

Figure 2A:
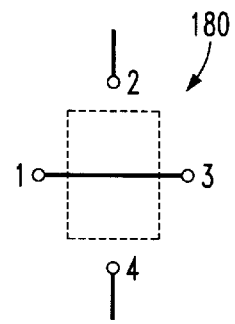
FIGS. 2A, 2B and 2C illustrate different network configurations that may be used to complete the current-sharing snubber circuit illustrated in FIG. 1.
Figure 2B:
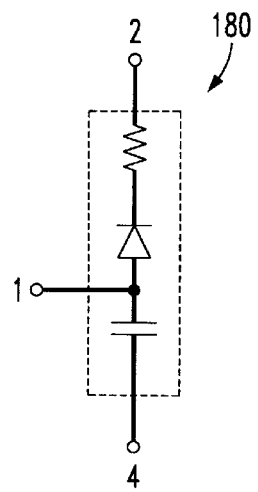
Figure 2C:
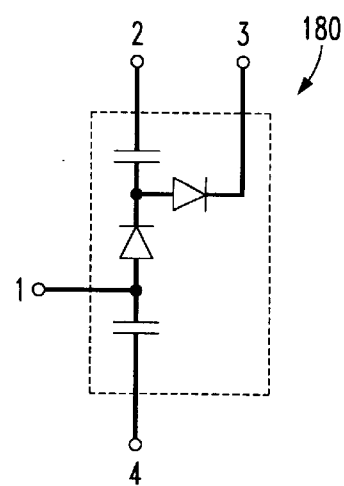

Turning now to FIGS. 2A, 2B and 2C, and with continuing reference to FIG. 1, illustrated are different network configurations that may be used to complete the current-sharing snubber circuit 160 illustrated in FIG. 1. FIG. 2A depicts the circuit configuration needed to accomplish a current-sharing and turn-on snubber. Implementation of the circuit configuration illustrated in FIG. 2B results in a current-sharing snubber with a turn-on and turn-off loss reduction feature. The implementation of the circuit configuration depicted in FIG. 2C results in a current-sharing, energy recovery and non-dissipative snubber.

Figure 3:
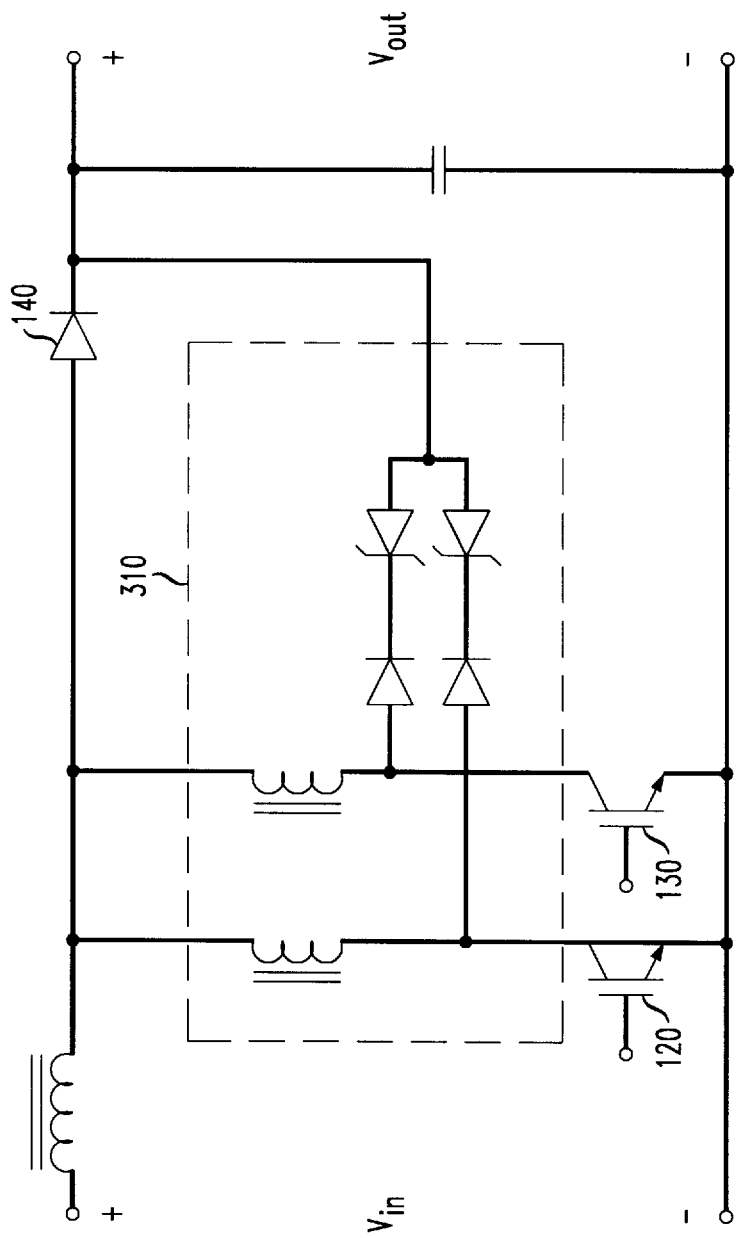
FIG. 3 illustrates a schematic diagram of an embodiment of a boost converter employing a current-sharing snubber formed with the sub-circuit illustrated in FIG. 2A.

Turning now to FIG. 3, illustrated is a schematic diagram of an embodiment of a boost converter employing a current-sharing snubber 310 formed with the sub-circuit illustrated in FIG. 2A. The current-sharing snubber 310 can also be used to reduce the boost diode 140 reverse recovery current during the turn-on transitions of the first and second boost switches 120, 130. To include the turn-off loss reduction feature of the main boost switch (comprised of the first and second boost switches 120, 130), the circuit configuration depicted in FIG. 2B may be used.

Figure 4:
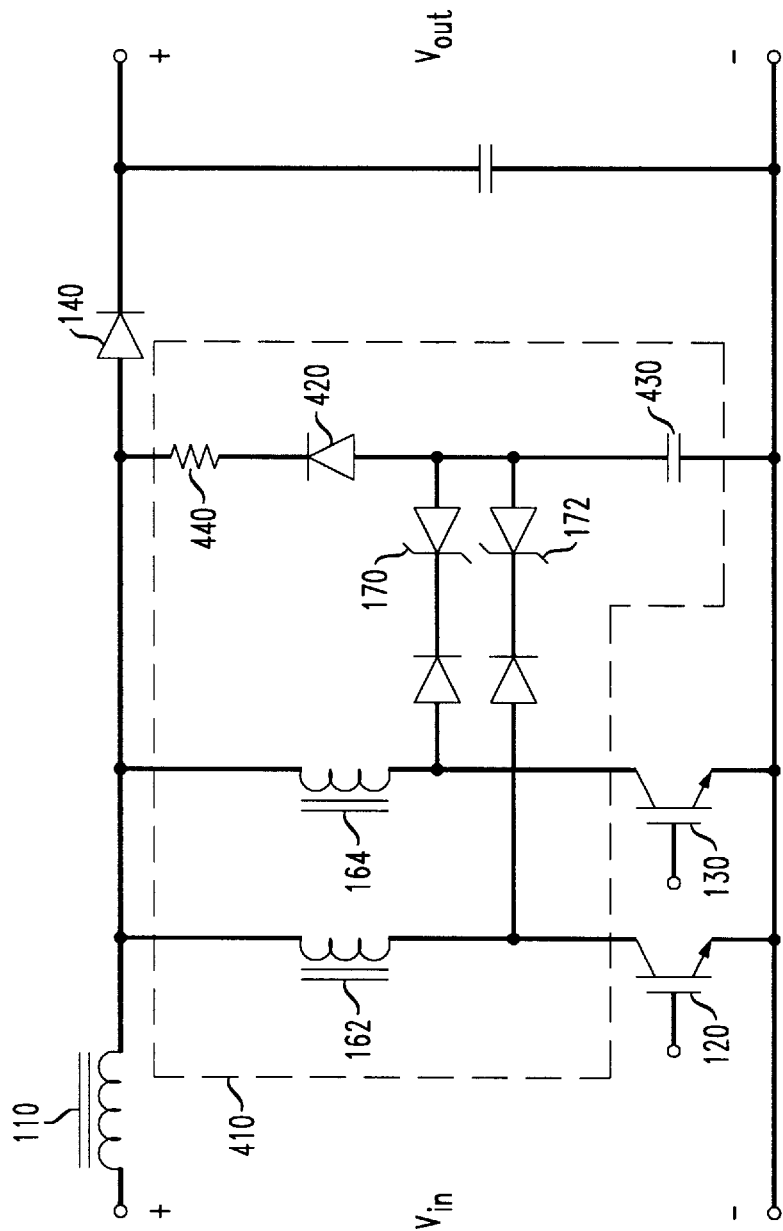
FIG. 4 illustrates a schematic diagram of an embodiment of a boost converter employing a current-sharing snubber formed with the sub-circuit illustrated in FIG. 2B.

Turning now to FIG. 4, illustrated is a schematic diagram of an embodiment of a boost converter employing a current-sharing snubber 410 formed with the sub-circuit illustrated in FIG. 2B. The sub-circuit includes a third snubber diode 420 that is coupled to a snubber capacitor 430 and a snubber resistor 440. In an advantageous embodiment, the snubber resistor 440 has a low resistance value. The snubber capacitor 430 is used to reduce the first and second boost switches 120, 130 turn-off dv/dt. The snubber resistor 440 is used to dissipate the first and second boost switches 120, 130 turn-off energy which has been stored in the snubber capacitor 430 during the first and second boost switches 120, 130 turn-on transitions. The snubber resistor 440 also conducts the reverse recovery current which was built up during the boost diode 140 reverse recovery process. After the boost diode 140 stops the reverse recovery process, the snubber resistor 440 freewheels the current. The snubber diode 420 blocks the bus voltage during the periods when the first and second boost switches 120, 130 are turned off, i.e., not conducting. The presence of the first and second snubber zener diodes 170, 172, along with the snubber resistor 440 forces the currents in the first and second snubber inductors 162, 164 to reduce to zero rapidly during the first and second boost switches 120, 130 turn-off transitions. With the currents in the first and second snubber inductors 162, 164 reduced to zero, the boost inductor 110 current is forced to transfer to the output through the boost diode 140.

Implementing the sub-circuit depicted in FIG. 2C by replacing the dissipative component, the snubber resistor 440, with a second snubber capacitor and adding a second snubber diode results in an energy recovery, almost substantially non-dissipative snubber configuration. This almost substantially lossless snubber circuit provides current-sharing capability for the main boost switch (the first and second boost switches 120, 130) while recovering the boost switch turn-off energy and the boost diode reverse recovery energy to the output. The description and operation of this lossless current-sharing snubber may be explained in greater detail by referring to FIGS. 5 and 6.

Figure 5:
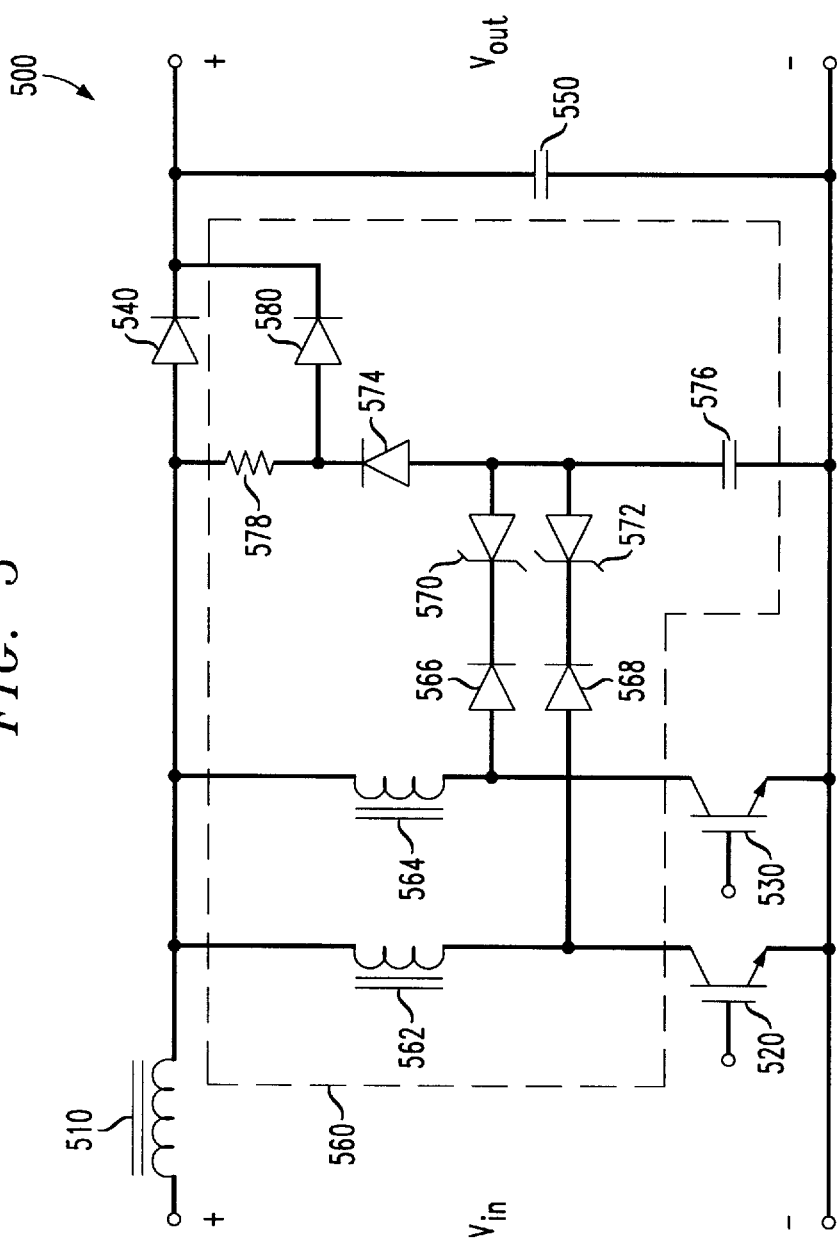
FIG. 5 illustrates a schematic diagram of an embodiment of a boost converter employing a lossless current-sharing snubber constructed according to the principles of the present invention.

Turning now to FIG. 5, illustrated is a schematic diagram of an embodiment of a boost converter 500 employing a lossless current-sharing snubber 560 constructed according to the principles of the present invention. The boost converter 500 includes a boost inductor 510 that is coupled to a boost diode 540 and the almost substantially lossless current-sharing snubber 560. The boost diode 540 is also coupled to the lossless current-sharing snubber 560 and to an output capacitor 550. Also shown are first and second boost switches 520, 530 that are coupled to the output capacitor 550.

The lossless current-sharing snubber 560 includes first and second snubber inductors 562, 564 which are coupled to first and second snubber diodes 566, 568, respectively. The first and second snubber diodes 566, 568, in turn, are coupled to first and second snubber zener diodes 570, 572, respectively. Alternatively, in another embodiment, the first and second snubber diodes 566, 568 are coupled to a first and second snubber resistors, respectively, which may be substituted for the first and second snubber zener diodes 570, 572. A third diode 574 is coupled to the first and second snubber zener diode 570, 572, first and second snubber capacitors 576, 578 and a fourth snubber diode 580.

Figure 6:
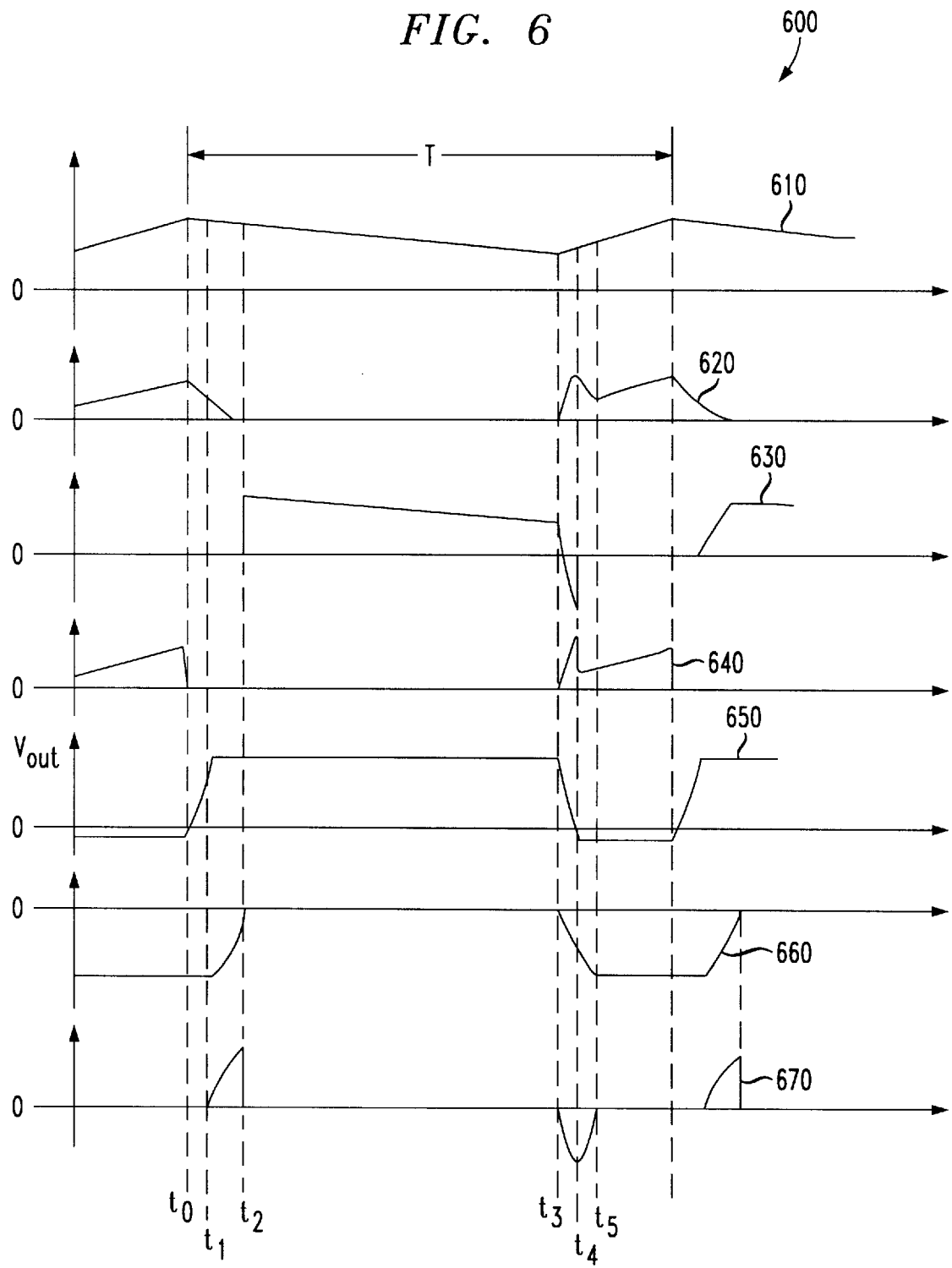
FIG. 6 illustrates exemplary current and voltage waveforms generated by the boost converter illustrated in FIG. 5.

Turning now to FIG. 6, with continuing reference to FIG. 5, illustrated are exemplary current and voltage waveforms generated by the boost converter 500 illustrated in FIG. 5. A first waveform 610 depicts current through the boost inductor 510 over one switching cycle, designated T. Similarly, second, third, fourth, fifth, sixth and seventh waveforms 620, 630, 640, 650, 660, 670 depict the first snubber inductor 562 current, the boost diode 540 current, the first boost switch 520 current, the voltage across the first snubber capacitor 576, the voltage across the second snubber capacitor 578 and the current through the second snubber capacitor 578, respectively, over one switching cycle.

The operation of the almost substantially lossless current-sharing snubber 560 will hereinafter be described with the following assumptions: (1) the first and second boost switches 520, 530 are in parallel and are turned on and off simultaneously; (2) the boost inductor 510 is operated in continuous conduction mode (CCM) and is significantly larger than the first and second snubber inductors 562, 564, which are equal in value and (3) the second snubber capacitor 578 is significantly larger than the first snubber capacitor 576.

Initially, both the first and second boost switches 520, 530 are conducting. The boost inductor 510 current and the currents through the first and second boost switches 520, 530 increase linearly due to the constant input voltage during each switching cycle. The switching of the boost switch (the combination of the first and second boost switches 520, 530) depend on the output voltage and load regulation requirements. At time $t=t_0$, both the first and second boost switches 520, 530 are turned off. Since the current in the boost inductor 510 may not change instantaneously, the current is directed to charge the first snubber capacitor 576. The first snubber capacitor 576 contributes to the reduction of the boost switch turn-off dv/dt, which in turn reduces the boost switch turn-off power loss.

At time $t=t_1$, the voltage across the first snubber capacitor 576 is equal to the output voltage $V_{out}$ and since the second snubber capacitor 578 has a negative voltage across it, the currents in the first and second snubber inductors 562, 564 is forced to reduce to zero and discharge to the output through the fourth snubber diode 580. The boost inductor 510 current begins to flow through the second snubber capacitor 578 and the fourth snubber diode 580 to the output of the boost converter 500. During the time period from $t_1$ to $t_2$, the energy that has been stored in the second snubber capacitor 578 is also recovered to the output of the boost converter 500 via the fourth snubber diode 580.

At time $t=t_2$, the currents in the first and second snubber inductors 562, 564 are reduced to zero. If there is sufficient energy stored in the second snubber capacitor 578, the second snubber capacitor 578 does not fully discharge. Rather, the second snubber capacitor 578 continues to discharge, recovering the energy that has been previously stored to the output. If, however, the second snubber capacitor 578 has been fully discharged, the boost inductor 510 current begins to discharge to the output through the boost diode 540. For the remaining period up to time t=$t_3$, the boost converter 500 operation is the same as a conventional boost converter.

At time t=$t_3$, the first and second boost switches 520, 530 are turned on due to a constant switching period control. When the first and second boost switches 520, 530 begin conducting, the boost diode 540 also begins the reverse recovery. The peak reverse recovery current is limited by the series-connected first and second snubber inductors 562, 564, while during the same period, the first snubber capacitor 576 discharges through the second snubber capacitor 578, the third snubber diode 574 and the first and second snubber inductors 562, 564. The turn-off energy stored in the first snubber capacitor 576 is transferred to the second snubber capacitor 578 and the first and second snubber inductors 562, 564, and since the second snubber capacitor 578 is much larger than the first snubber capacitor 576, the voltage across the second snubber capacitor 578 is not increased significantly.

At time t=$t_4$, the boost diode 540 stops the reverse recovery (which is determined by the boost diode 540 itself) and the energy stored in the first and second snubber inductors 562, 564 begins to charge the second snubber capacitor 578 through the first and second snubber diodes 566, 568, the first and second snubber zener diodes 570, 572 and the third snubber diode 574. The first snubber capacitor 576 is reverse-charged up to the zener voltage of the first or second snubber zener diodes 570, 572 through the first and second boost switches 520, 530 which helps to retard the voltage rise time during boost switch turn-off transitions, i.e., reducing dv/dt.

At time t=$t_5$, the current in the second snubber capacitor 578 is reduced to zero and the second snubber capacitor 578 has been charged to its negative peak value. The energy stored in the second snubber capacitor 578 is then recovered to the boost converter output during the boost switch turn-off transition. For the rest of the switching cycle, the boost inductor 510 current increases linearly. At the end of the switching cycle, the process described above is repeated for the duration of the boost converter 500 operation.

Although the embodiments and operation of the present invention have been described in detail with regard to two switches that are parallel-connected, those skilled in the art should appreciate that the present invention also encompasses circuit configurations that employ multiple (two or more) switches coupled in parallel.

From the above, it is apparent that the present invention provides an effective means to share the boost switch current, allowing the efficient utilization of the semiconductors employed in the boost converter while the current-sharing feature in the boost switches further increases system reliability. The snubber circuit disclosed by the present invention also does not have any control requirements to further increase the design complexities. The location of the snubber inductors outside the main power transfer path also minimizes the conduction losses when the switching duty ratio is less than 0.5.

Although the present invention and its advantages have been described in detail, those skilled in the art should understand that they can make various changes, substitutions and alterations herein without departing from the spirit and scope of the invention in its broadest form.

What is claimed is:

1. For use in a boost converter having first and second boost switches coupled in parallel, a snubber for improving current sharing between said first and second boost switches, comprising:

first and second snubber inductors, series-coupled with said first and second boost switches, respectively, that limit a flow rate of said electrical current in said first and second switches, respectively, as a function of a rate of said flow; and a conductive path coupled to a first node between said first snubber inductor and said first boost switch and a second node between said second snubber inductor and said second boost switch, that conducts a turn-off energy of said first and second boost switches from said first and second nodes toward an output of said boost converter.

2. The snubber as recited in claim 1 wherein said first and second boost switches are insulated gate bipolar transistors (IGBTs).

3. The snubber as recited in claim 1 wherein said conductive path further comprises first and second snubber diodes series-coupled with first and second zener diodes, respectively.

4. The snubber as recited in claim 1 wherein said conductive path further comprises first and second snubber diodes series-coupled with first and second resistors, respectively.

5. The snubber as recited in claim 1 wherein said conductive path conducts said turn-off energy of said first and second boost switches to an output terminal of a boost diode of said boost converter.

6. The snubber as recited in claim 1 wherein said conductive path is coupled to power terminals of said first and second boost switches and conducts said turn-off energy of said first and second boost switches to an input terminal of a boost diode of said boost converter.

7. The snubber as recited in claim 1 wherein said conductive path is coupled to power terminals of said first and second boost switches and conducts said turn-off energy of said first and second boost switches to both input and output terminals of a boost diode of said boost converter.

8. For use in a boost converter having first and second boost switches coupled in parallel, a method of improving current sharing between said first and second boost switches, comprising the steps of:

limiting a flow rate of said electrical current in said first and second switches with first and second snubber inductors series-coupled with said first and second boost switches, respectively, as a function of a rate of said flow; and conducting a turn-off energy of said first and second boost switches from said first and second nodes toward an output of said boost converter with a conductive path.

9. The method as recited in claim 8 wherein said first and second boost switches are insulated gate bipolar transistors (IGBTs).

10. The method as recited in claim 8 wherein said conductive path further comprises first and second snubber diodes series-coupled with first and second zener diodes, respectively.

11. The method as recited in claim 8 wherein said conductive path further comprises first and second snubber diodes series-coupled with first and second resistors, respectively.

12. The method as recited in claim 8 wherein said step of conducting comprises the step of conducting said turn-off energy of said first and second boost switches to an output terminal of a boost diode of said boost converter.

13. The method as recited in claim 8 wherein said conductive path is coupled to power terminals of said first and second boost switches, said step of conducting comprising the step of conducting said turn-off energy of said first and second boost switches to an input terminal of a boost diode of said boost converter.

14. The method as recited in claim 8 wherein said conductive path is coupled to power terminals of said first and second boost switches, said step of conducting comprising the step of conducting said turn-off energy of said first and second boost switches to both input and output terminals of a boost diode of said boost converter.

15. A boost converter, comprising:

a series-coupled boost inductor and boost diode;

first and second boost switches coupled in parallel to a node between said boost inductor and said boost diode; and a snubber for improving current sharing between said first and second boost switches, including:

first and second snubber inductors, series-coupled with said first and second boost switches, respectively, that limit a flow rate of said electrical current in said first and second switches, respectively, as a function of a rate of said flow, and a conductive path coupled to a first node between said first snubber inductor and said first boost switch and a second node between said second snubber inductor and said second boost switch, that conducts a turn-off energy of said first and second boost switches from said first and second nodes toward said boost diode.

16. The boost converter as recited in claim 15 wherein said first and second boost switches are insulated gate bipolar transistors (IGBTs).

17. The boost converter as recited in claim 15 wherein said conductive path further comprises first and second snubber diodes series-coupled with first and second zener diodes, respectively.

18. The boost converter as recited in claim 15 wherein said conductive path further comprises first and second snubber diodes series-coupled with first and second resistors, respectively.

19. The boost converter as recited in claim 15 wherein said conductive path conducts said turn-off energy of said first and second boost switches to an output terminal of said boost diode.

20. The boost converter as recited in claim 15 wherein said conductive path is coupled to power terminals of said first and second boost switches and conducts said turn-off energy of said first and second boost switches to an input terminal of said boost diode.

21. The boost converter as recited in claim 15 wherein said conductive path is coupled to power terminals of said first and second boost switches and conducts said turn-off energy of said first and second boost switches to both input and output terminals of said boost diode.

\* \* \* \* \*